United States Patent [19]

van de Plassche

[11] 3,922,614

[45] Nov. 25, 1975

[54] AMPLIFIER CIRCUIT

[75] Inventor: Rody Johan van de Plassche, Eindhoven, Netherlands

[73] Assignee: U.S. Philips Corporation, New York, N.Y.

[22] Filed: July 10, 1974

[21] Appl. No.: 486,977

[30] Foreign Application Priority Data

July 13, 1973 Netherlands ........................ 7309767

[52] U.S. Cl. ..................... 330/30 D; 330/18; 330/19

[51] Int. Cl.² ........................................... H03F 3/45

[58] Field of Search ....... 330/30 R, 30 D, 35, 38 M, 330/69, 19, 18

[56] References Cited

UNITED STATES PATENTS

| | | | |
|---|---|---|---|
| 3,699,464 | 10/1972 | Zobel | 330/30 D X |
| 3,760,288 | 9/1973 | Leonard | 330/38 M X |

*Primary Examiner*—James B. Mullins

*Attorney, Agent, or Firm*—Frank R. Trifari; Ronald L. Drumheller

[57] ABSTRACT

Amplifier circuit having an input differential stage which has a first current mirror as the collector load. The output signal from this differential stage, which is transformed into an unbalanced signal by means of said current mirror, is amplified by means of a current amplifier and is supplied to the sum terminal of the first current mirror. This current mirror is connected to the input of a second current mirror the output of which supplies the output current of the amplifier circuit. For high frequencies the current amplifier may be shunted by a coupling capacitor connected between the input of the current amplifier and a low-impedance input of a coupling circuit which may comprise a current mirror the output of which is connected to the output of the second current mirror.

6 Claims, 4 Drawing Figures

AMPLIFIER CIRCUIT

Figures 1, 2:
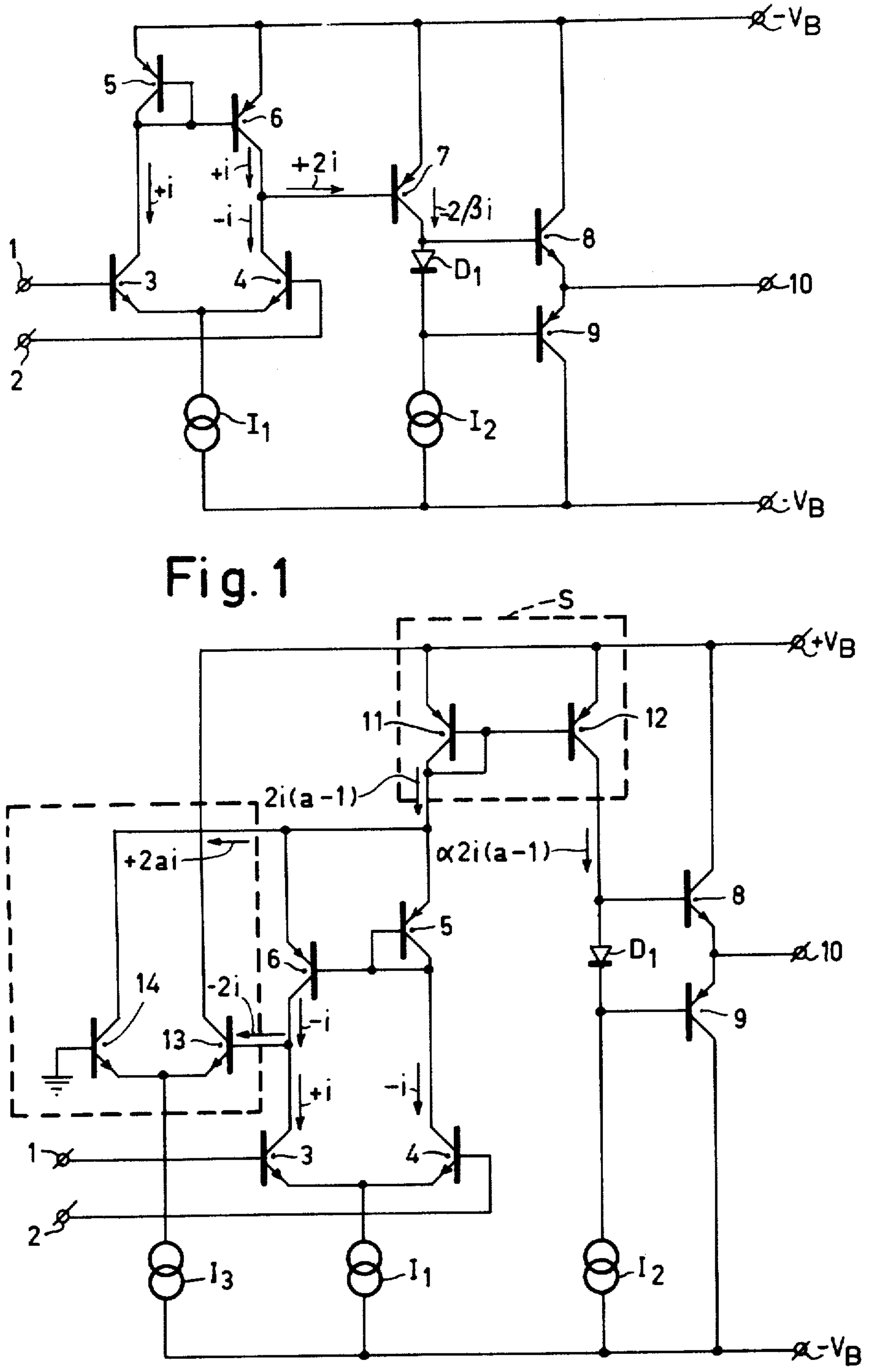

The invention relates to an amplifier circuit which comprises a first and a second transistor, which are connected as a differential pair, and a first current mirror circuit, which has an input circuit between an input terminal and a summing terminal and an output circuit between an output terminal and the said summing terminal and which reproduces a current supplied to its input terminal with unity amplification at its output terminal, the input circuit of the current mirror circuit being connected in series with the main current path of the first transistor, whilst the output circuit is connected in series with the main current path of the second transistor, the output terminal of the amplifier circuit being connected to the lead which connects the second transistor to the output terminal of the current mirror circuit.

Such an amplifier circuit is described in "International Solid State Circuit Conference" (ISSCC) February 1969, pages 16–17. In the amplifier described the first current mirror circuit serves as a load for the transistors, which are connected as a differential pair, and also converts the balanced currents which flow through the first and second transistors into an unbalanced output current. The unbalanced output current generally is amplified by means of a further transistor and then may be supplied, for example, to a class-B output stage.

It has been found that the frequency behaviour of the said amplifier circuit is adversely affected by the parasitic capacitance between the base and the collector of the further transistor, which capacitance acts apparently increased in the output impedance owing to the Miller effect. The factor by which the said real base-collector capacitance is multiplied is about equal to the current gain factor between the base and collector currents of the said transistor. This means that the effective capacitance can vary over a comparatively large range and increases with increase in the gain.

It is an object of the present invention to provide an amplifier circuit of the abovedescribed type which shows improved frequency behaviour and at the same time permits large amplification. For this purpose the amplifier circuit according to the invention is characterized in that the current at the output terminal of the amplifier circuit is amplified by means of a current amplifier the output current from which is supplied to the summing terminal of the first current mirror circuit, which summing terminal is also connected to the input terminal of a second current mirror circuit which has an input circuit and an output circuit and by which a current flowing in its input circuit is reproduced in a fixed ratio in its output circuit, said current becoming available, via the output circuit of the second current mirror, as the output current at an output of the amplifier circuit.

Because the output of the amplifier circuit is constituted by the output of the second current mirror circuit which has an output impedance which in terms of capacitance is comparatively small, the effective capacitance at the output of the amplifier also is comparatively small. The desired amplification is achieved by means of the current amplifier, because the current supplied by this current amplifier to the summing terminal of the first current mirror circuit automatically acts, with opposite phase, as the input current for the second current mirror circuit and by the latter is supplied at the output.

If further the current amplifier is such that the output signal current from the current amplifier is in phase with the signal currents which flow in the two circuits in the first current mirror, the said two signal current components will appear with the same phase in the output current of the second current mirror circuit and hence act in support of one another.

A particularly simple embodiment of the current amplifier which satisfies the abovementioned condition with respect to the phase of the output signal current and which in addition is advantageous with respect to the overall dissipation of the circuit, is characterized by the provision of a third and a fourth transistor which are connected in a Darlington configuration, the input of the current amplifier being constituted by the control electrode of the third transistor, whilst the output current is supplied by the fourth transistor. This embodiment has the advantage that the quiescent current for the fourth transistor is obtainable from the quiescent current flowing through the first current mirror, so that the overall dissipation of the circuit will be a minimum.

In a further preferred embodiment of the amplifier circuit according to the invention the second current mirror circuit has an input circuit including the main current path of a fifth transistor and an output circuit including the series combination of a semiconductor junction and the main current path of a sixth transistor, the semiconductor junction shunting the base-emitter path of the fifth transistor whilst the base and the collector of the sixth transistor are connected to the input terminal and to the output terminal respectively of the current mirror circuit, the main current path of the output transistor of the current amplifier being connected in parallel with the base emitter path of the sixth transistor. This results in that at the output of the second current mirror circuit the signal current supplied by the current amplifier appears amplified by a factor of two.

The amplifier circuit according to the invention is particularly suitable for realizing an amplifier having a large amplification factor which can be provided with complete negative feedback without the likelihood of instabilities. For this purpose it is known to shunt amplifier stages at high frequencies to obtain an attenuation of approximately 6 dB/octave in the critical point of the amplitude-frequency characteristic. The amplifier circuit according to the invention can simply be adapted to such a step. In a preferred embodiment a coupling capacitance is connected between the input of the current amplifier and a low-resistance input of a coupling circuit, the current flowing through the coupling capacitance being supplied to the output of the amplifier circuit via the said coupling circuit.

A particularly advantageous embodiment uses a coupling circuit which comprises a third current mirror circuit having an input circuit which includes the main current path of an eighth transistor and an output circuit which includes the series combination of the main current path of a ninth transistor and of a diode, or of a tenth transistor connected as a diode, the said diode or tenth transistor connected as a diode being connected in parallel with the junction between the control electrode and the first main electrode of the eighth transistor, whilst the junction between the control electrode and the second main electrode of said eighth transistor is connected in parallel with the junction between the control electrode and the first main electrode of the ninth transistor, a constant current being supplied to the input circuit, whilst the coupling capacitance is connected to the control electrode of the eighth transistor, the current flowing through the output circuit of said third current mirror circuit being supplied to the output of the amplifier.

Embodiments of the invention will now be described, by way of example, with reference to the accompanying diagrammatic drawings, in which:

FIG. 1 is the circuit diagram of the known amplifier circuit, and

Figure 3:
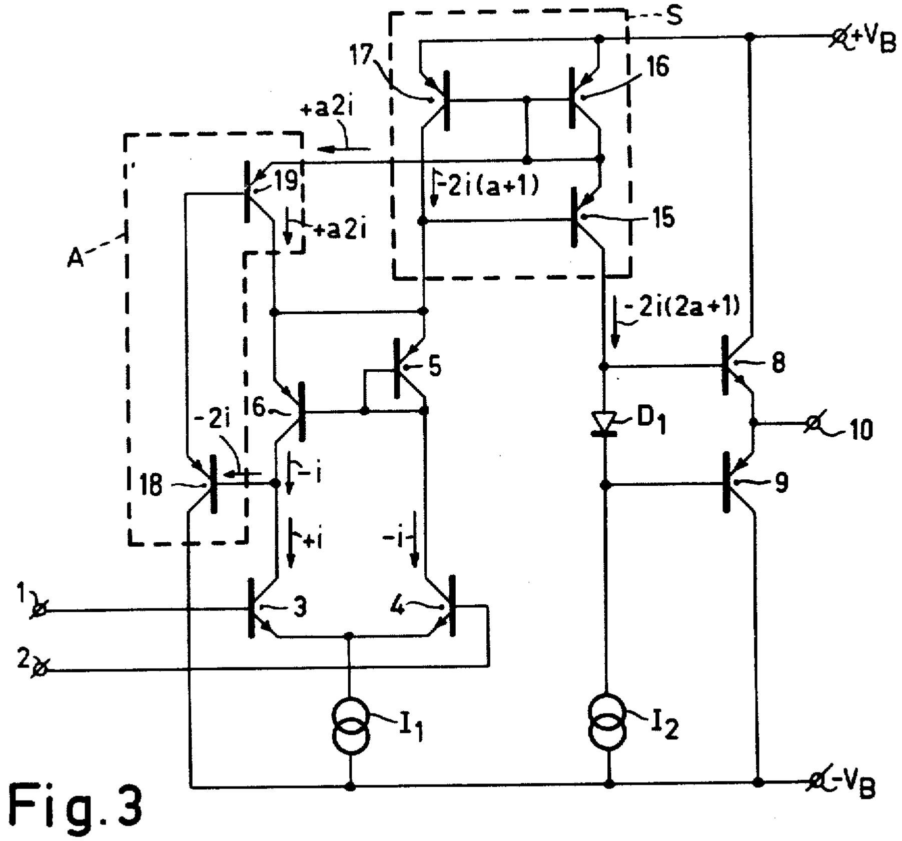
Figure 4:
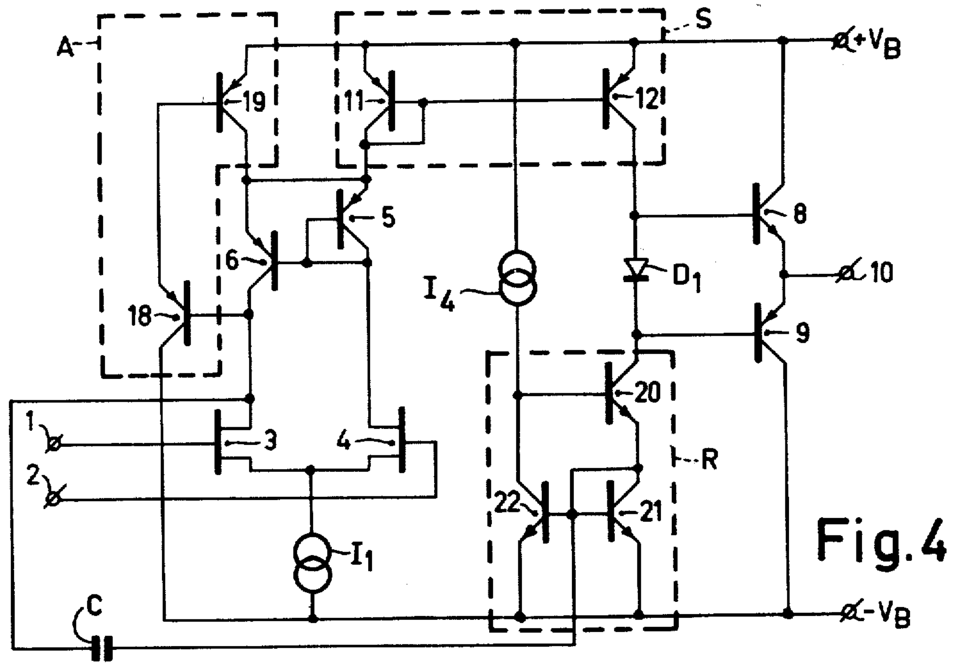

FIGS. 2 to 4 each show a different embodiment of the amplifier circuit according to the invention.

In the said four Figures corresponding elements are always indicated by like reference numerals and letters.

Referring now to FIG. 1, the known amplifier circuit includes npn transistors 3 and 4 which are connected as a differential pair and the bases of which form the input terminals 1 and 2 of the amplifier and which have a current source $I_1$ as a common emitter impedance. The collector load for both transistors 3 and 4 is constituted by a current mirror circuit including pnp transistors 5 and 6, the transistor 5 being connected as a diode and shunting the emitter base path of the transistor 6. If the emitter surface areas of the two transistors 5 and 6 manufactured in integrated-circuit form are equal, the current supplied to the transistor 5 is reproduced in the form of the collector current of the transistor 6, assuming the base current of the transistor 6 to be negligible.

By means of this current mirror circuit the balanced currents ($+i$ and $-i$) of the two transistors 3 and 4 are converted into an unbalanced signal current ($+ 2i$) which is supplied to the base of a pnp transistor 7 the emitter of which is connected to the positive terminal $+V_B$ of the supply source. The transistor 7 amplifies the signal current supplied to its base and passes the amplified signal current ($-2\ \beta\ i$) to a class-B output stage which includes transistors 8 and 9 the common emitters of which form the output 10 of the amplifier. The quiescent current of the transistor 7 is supplied by a current source $I_2$ which is connected to the collector of the transsitor 7 via a diode $D_1$ which is connected in the pass direction between the bases of the transistors 8 and 9 to reduce the take-over distortion of the transistors 8 and 9.

The frequency behaviour of this amplifier circuit is largely determined by the value of the effective capacitance at the collector of the transistor 7. Owing to the Miller effect, the real capacitive impedance which is produced at said collector as a result of the stray capacitance $C_{bc}$ between the base and the collector of transistor 7 is approximately $(1 + \beta)\ C_{bc}$, where $\beta$ is the current gain factor of the collector current with respect to the base current of the transistor. This means that the effective capacitance at the collector of the transistor 7 may be considerable and furthermore owing to the large differences in $\beta$ may considerably differ in different circuits. This results in objectionable and unpredictable frequency behaviour of the circuit, in particular if high-frequency amplifier stages are to be shunted in order to obtain a desired frequency attenuation, for example a first-order attenuation.

The circuit according to the invention provides considerable improvement in this respect. A first embodiment of the said circuit is shown in FIG. 2. The amplifier circuit includes the transistors 3 and 4 which are connected as a differential pair and have a current mirror circuit including transistors 5 and 6 as a collector load. So far the amplifier circuit is identical with the known amplifier circuit shown in FIG. 1.

However, the amplifier circuit now also includes a second current mirror circuit S, which comprises a pnp transistor 11 connected as a diode and a pnp transistor 12 and the input of which is connected to the sum terminal of the first current mirror circuit (transistors 5 and 6) whilst the output supplies the output current of the amplifier circuit which can be supplied, in a manner similar to that described with reference to FIG. 1, to a class-B output stage comprising transistors 8 and 9 and a diode $D_1$. Furthermore the amplifier circuit includes a current amplifier A. This current amplifier comprises, for example, two npn transistors 13 and 14 which are connected as a differential pair and have a common emitter impedance in the form of a current source $I_3$. The base of the transistor 14 is connected to earth potential, and the base of the transistor 13 forms the input of the current amplifier and is connected to the collectors of the transistors 3 and 6. The collector of the transistor 13 is connected to the positive supply terminal $+V_B$, and the collector of the transistor 14 forms the output of the current amplifier and supplies an output current to the sum terminal of the current mirror circuit comprising the transistors 5 and 6.

Assuming again that the input terminal 1 is positive with respect to the input terminal 2 so that the collector current of the transistor 3 contains a signal-current component $+i$ and the collector current of the transistor 4 contains a signal-current component $+i$, the input current for the current amplifier A is equal to $2i$. Assuming further that the current gain factor of the current amplifier A in absolute value is equal to $a$, then the output current from this current amplifier will be $+a2i$. Because the output current from the current amplifier and the signal currents which flow in the two circuits of the current mirror circuit comprising the transistors 5 and 6 are applied to the input of the current mirror S, it can simply be seen that the output current of this current mirror S contains a signal-current component $\alpha\ 2i\ (a - 1)$, where $\alpha$ is the current gain of the output current of the current mirror relative to its input current, which gain is determined by the ratio between the surface areas of the transistors 11 and 12.

The great advantage of the circuit shown is the fact that the effective capacitance at the collector of the transistor 12 is considerably smaller than the effective capacitance at the collector of the transistor 7 in the known amplifier circuit. This effective capacitance here is only $(1 + \alpha)\ C_{bc}$, where $C_{bc}$ is the collector-base capacitance of the transistor 12 and $\alpha$ is the current gain of the current mirror S. Apart from the fact that this capacitance is considerably smaller than in the known circuit there is the further advantage that the value of this capacitance is predictable, because the values of the current gain factors of the various transistors substantially do not affect the value of this effective capacitance. Furthermore the overall amplification may be considerable, because the current gain factor $a$ of the differential amplifier A may be large.

FIG. 3 shows a second embodiment of the amplifier circuit according to the invention. In this embodiment, the second current mirror circuit S in known manner comprises three transistors 15, 16 and 17, the transistor 16 being connected as a diode. The current amplifier A now comprises two transistors 18 and 19 connected in a Darlington configuration, the base of the transistor 18 being the input of the current amplifier and driving the transistor 19 in an emitter follower circuit, whilst the collector of the transistor 19 is connected to the common emitters of the transistors 5 and 6. The emitter of the transistor 19 is connected to the bases of the transistors 16 and 17.

Starting from the same assumption with respect to the signal components in the collector currents of the transistors 3 and 4 as made in FIG. 2, the signal component in the input current of the current mirror S is found to the equal to $-2i\ (a + 1)$ where $a$ again is the overall current amplification of the current amplifier A. This provides a gain relative to the circuit shown in FIG. 2 in that the contribution of the current amplifier A and that of the current mirror comprising the transistors 5 and 6 have equal signs and hence act in support of one another. In the circuit shown in FIG. 2 this obviously is also obtainable by connecting the collector of the transistor 13 to the emitters of the transistors 5 and 6 instead of the collector of the transistor 14.

A second gain is acquired by the connection between the emitter of the transistor 19 and the base of the transistor 17, for this ensures that the effect of the output current from the current amplifier A, which current flows through the transistor 19, is double, because the collector current $+a2i$ of this transistor 19 is operative in the input circuit of the current mirror S and hence provides a contribution of $-a2i$ to the output current of this current mirror S, assuming the current mirror S to have unity current amplification. The emitter current of this transistor 19, which for the sake of simplicity is also assumed to be $+a2i$, however, also provides a contribution of $-a2i$ to the signal output current of the current mirror S, so that the overall contribution of the current amplifier A to the signal output current of the current mirror S is equal to $-a4i$, which means a gain by a factor of two relative to the circuit shown in FIG. 2. The output impedance of the triplet current mirror S used is very high again and includes a small capacitive component.

FIG. 4 shows a third embodiment of the amplifier circuit according to the invention. Again the amplifier comprises input transistors 3 and 4 which are connected as a differential pair and in this embodiment are field-effect transistors. The structure of the current amplifier A is identical with that of FIG. 3 except that now the emitter of the transistor 19 is connected to the positive supply terminal $+V_B$. The current mirror S comprises two transistors 11 and 12. In order to obtain a stable system under any conditions it is desirable for at least one amplifier stage to be shunted for elevated frequencies. The amplifier circuit according to the invention is found to be particularly suited to such a configuration.

For this purpose the amplifier circuit includes a third current mirror circuit R which in known manner comprises transistors 20 and 21 and a transistor 21 connected as a diode and which, apart from the conductivity type of the transistors, is identical with the current mirror S used in FIG. 3. A constant current is supplied to the input of the current mirror R by a current source $I_4$. The output of the current mirror, which is constituted by the collector of the transistor 20, is connected to the diode $D_1$, so that normally this current mirror R forms the current source $I_2$ of FIGS. 2 and 3.

In order to shunt the current amplifier A at high frequencies, the input of this current amplifier is connected via a capacitor C to the transistor 21 connected as a diode. At high frequencies, for which the capacitor C is a short-circuit, the impedance constituted for the signal current by this path is very small and hence this signal current is no longer absorbed by the current amplifier A but flows entirely into the current mirror R. Because the transistor 21 connected as a diode necessarily carries a constant current, the signal current which flows through the capacitor C is absorbed by the transistor 20 and becomes available at the output of the amplifier circuit with the correct phase.

Owing to the structure of the amplifier circuit, at the said high frequencies an additional signal component supplied by the current mirror S appears at the output, for when the current amplifier A is switched off the current mirror S still carries a signal component, i.e. the signal currents supplied by the transistors 5 and 6. This contribution disappears only at frequencies at which the pnp transistors do not work any longer.

Obviously the invention is not restricted to the embodiments shown. For example, the current mirror S and the current mirror which serves as a collector load for the input transistors may be any type of current mirror circuit. The mirror ratio of the current mirror which acts as the collector load, i.e. the ratio between its input current and its output current, must necessarily be unity, but this certainly does not apply to the current mirror S. The desired mirror ratio may be determined by means of the surface area ratio of the transistors or by means of resistors included in the emitter leads of said transistors.

The circuit need not employ bipolar transistors. As has been mentioned above, the input stage may suitably comprise field-effect transistors, possibly insulated gate field-effect transistors. In the present state of the art current mirror circuits generally use bipolar transistors.

The high frequency coupling need not necessarily be effected in a manner as shown in FIG. 4. Obviously, the signal current passed by the capacitor C may alternatively be supplied to the input of a current mirror, for this also has a low impedance. To achieve coupling with the correct phase, the output current from said current mirror must be mirrored, another time before being supplied to the output.

What is claimed is:

1. Amplifier circuit, comprising:

a first and a second transistor connected as a differential pair, said first and second transistor each having a main current path;

a first and a second current mirror circuit each having an input circuit between an input terminal and a sum terminal and an output circuit between an output terminal and said sum terminal, for reproducing at said output terminal thereof with fixed gain the current supplied to said input terminal thereof, the gain of said first current mirror circuit being unity, said input circuit of said first current mirror circuit being connected in series with said main current path of said first transistor, said output circuit of said first current mirror being connected in series with said main current path of said second transistor and said input terminal of said second current mirror circuit being connected to said sum terminal of said first current mirror circuit; and a current amplifier having an input and output, said input of said current amplifier being connected to said output terminal of said first current mirror circuit and said output of said current amplifier being connected to said sum terminal of said first current mirror circuit.

2. Amplifier circuit as claimed in claim 1, wherein signal current at said output of said current amplifier is in phase with signal current in said input and output circuits of said first current mirror circuit.

3. Amplifier circuit as claimed in claim 2, wherein said current amplifier comprises a third and a fourth transistor connected in a Darlington configuration, said third and fourth transistors each having a control electrode and two main electrodes, said input of said current amplifier being said control electrode of said third transistor and said output of said current amplifier being one of said main electrodes of said fourth transistor.

4. Amplifier circuit as claimed in claim 3, wherein said second current mirror circuit comprises a diode and a fifth and a sixth transistor, said fifth and sixth transistors each having a control electrode and two main electrodes defining a main current path, said main current path of said fifth transistor being in said input circuit of said second current mirror circuit, said main current path of said sixth transistor and said diode being in series in said output circuit of said second current mirror circuit, said diode being connected between said control electrode of said fifth transistor and one of said main electrodes thereof, said control electrode of sixth transistor being connected to the other of said main electrodes of said fifth transistor, and the other of said main electrodes of said fourth transistor being connected to said control electrode of said fifth transistor.

5. Amplifier circuit as claimed in claim 1 and further comprising a coupling circuit for shunting high frequency signal current from said input of said current amplifier to the output of said amplifier circuit.

6. Amplifier circuit as claimed in claim 5 wherein said coupling circuit comprises a constant current source, a capacitor and a third current mirror circuit, said third current mirror circuit comprising a diode and a third and a fourth transistor, said third and fourth transistors each having a control electrode and two main electrodes defining a main current path, said main current path of said third transistor being in series with said constant current source, said main current path of said fourth transistor and said diode being in series with each other and with said output circuit of said second current mirror circuit, said diode being connected between said control electrode of said third transistor and one of said main electrodes thereof, said control electrode of said fourth transistor being connected to the other of said main electrodes of said third transistor, and said capacitor connecting said input of said current amplifier to said control electrode of said third transistor.

* * * * *

UNITED STATES PATENT AND TRADEMARK OFFICE

CERTIFICATE OF CORRECTION

PATENT NO. : 3,922,614

DATED : November 25, 1975

INVENTOR(S) : RUDY JOHAN VAN DE PLASSCHE

It is certified that error appears in the above-identified patent and that said Letters Patent are hereby corrected as shown below:

In the title page, section [75], "Rody" should be --Rudy--

Column 4, line 31, "+i, the input" should be -- -i, the input--

Signed and Sealed this

Fourteenth Day of December 1976

[SEAL]

*Attest:*

RUTH C. MASON
*Attesting Officer*

C. MARSHALL DANN
*Commissioner of Patents and Trademarks*